(12) United States Patent
Hirano et al.

(10) Patent No.: US 12,106,948 B2
(45) Date of Patent: Oct. 1, 2024

(54) PLASMA PROCESSING APPARATUS AND MONITORING DEVICE

(71) Applicant: Tokyo Electron Limited, Tokyo (JP)

(72) Inventors: Ken Hirano, Miyagi (JP); Hiroki Endo, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 313 days.

(21) Appl. No.: 17/649,590

(22) Filed: Feb. 1, 2022

(65) Prior Publication Data

US 2022/0254617 A1 Aug. 11, 2022

(30) Foreign Application Priority Data

Feb. 10, 2021 (JP) .................. 2021-019646

(51) Int. Cl.
*H01J 37/32* (2006.01)

(52) U.S. Cl.
CPC .. *H01J 37/32981* (2013.01); *H01J 37/32174* (2013.01); *H01J 37/32449* (2013.01); *H01J 2237/0206* (2013.01)

(58) Field of Classification Search
None
See application file for complete search history.

(56) References Cited

U.S. PATENT DOCUMENTS

| | | | | |
|---|---|---|---|---|
| 5,474,648 A | * | 12/1995 | Patrick | H01J 37/32935 700/121 |
| 5,883,466 A | * | 3/1999 | Suyama | H01J 43/28 313/542 |
| 5,917,282 A | * | 6/1999 | Suyama | H01J 40/04 313/532 |
| 6,198,221 B1 | * | 3/2001 | Suyama | H01J 43/28 313/542 |
| 6,313,584 B1 | * | 11/2001 | Johnson | H01J 37/32183 315/111.21 |
| 9,881,807 B2 | * | 1/2018 | Ranjan | H01L 21/3065 |
| 10,231,321 B2 | * | 3/2019 | Valcore, Jr. | H05H 1/46 |
| 10,373,794 B2 | * | 8/2019 | Burkhart | H01J 37/244 |
| 10,505,348 B2 | * | 12/2019 | Gupta | H01J 37/3299 |
| 10,672,618 B2 | * | 6/2020 | Luong | H01L 21/32139 |
| 10,910,201 B1 | * | 2/2021 | Chen | H01L 21/3065 |
| 10,950,421 B2 | * | 3/2021 | Valcore, Jr. | H01J 37/32183 |

(Continued)

FOREIGN PATENT DOCUMENTS

| | | |
|---|---|---|
| JP | 2003-234332 | 8/2003 |
| WO | 2009/118920 | 10/2009 |

*Primary Examiner* — Srinivas Sathiraju
(74) *Attorney, Agent, or Firm* — IPUSA, PLLC

(57) ABSTRACT

A plasma processing apparatus includes a chamber; an apparatus-side controller configured to control plasma processing in the chamber; and a monitoring unit configured to monitor a monitoring target that is disposed within the chamber, or is connected directly or indirectly to the chamber. The apparatus-side controller sets the monitoring target and a timing at which monitoring target information is to be acquired. The monitoring unit acquires the monitoring target information transmitted from the monitoring target to the apparatus-side controller, detects an occurrence of an abnormality in the chamber based on the monitoring target information, and controls the monitoring target for the chamber in which the abnormality occurs.

15 Claims, 8 Drawing Sheets

(56) References Cited

U.S. PATENT DOCUMENTS

| | | | |
|---|---|---|---|
| 2005/0051095 A1* | 3/2005 | Kikuchi | H01J 37/32174 118/723 E |
| 2005/0136604 A1* | 6/2005 | Al-Bayati | H01L 29/7843 438/301 |
| 2005/0199341 A1* | 9/2005 | Delp | H01J 37/32 156/345.24 |
| 2005/0283321 A1* | 12/2005 | Yue | H01J 37/32935 702/30 |
| 2006/0163119 A1* | 7/2006 | Hirano | B07C 5/36 209/210 |
| 2009/0291440 A1* | 11/2009 | Hirano | C12Q 1/6874 435/91.5 |
| 2014/0106477 A1* | 4/2014 | Chen | H01L 22/26 702/191 |
| 2014/0296338 A1* | 10/2014 | Hirano | A61K 31/19 514/547 |
| 2014/0345802 A1* | 11/2014 | Umehara | H01J 37/32568 156/345.28 |
| 2015/0303033 A1* | 10/2015 | Bhutta | H01J 37/32183 315/111.51 |
| 2016/0240353 A1* | 8/2016 | Nagami | H01J 37/32577 |
| 2016/0268101 A1* | 9/2016 | Kaneko | H01J 37/32917 |
| 2016/0322203 A1* | 11/2016 | Bhutta | H01J 37/32935 |
| 2017/0062187 A1* | 3/2017 | Radomski | H01J 37/32155 |
| 2018/0330921 A1* | 11/2018 | Radomski | H01J 37/32174 |
| 2020/0111650 A1* | 4/2020 | Oka | H01L 21/67103 |
| 2020/0194299 A1* | 6/2020 | Balasubramanian | H01L 22/20 |
| 2020/0203130 A1* | 6/2020 | Bhutta | H01L 21/32136 |
| 2020/0219708 A1* | 7/2020 | Long | H01J 37/3211 |
| 2020/0286720 A1* | 9/2020 | van Greunen | G01R 31/245 |
| 2020/0357610 A1* | 11/2020 | Bhutta | H01L 21/31116 |
| 2020/0373128 A1* | 11/2020 | Ulrich | H01L 22/26 |
| 2020/0411289 A1* | 12/2020 | Radomski | H01J 37/32155 |
| 2020/0411339 A1* | 12/2020 | Endo | H05B 1/0233 |
| 2021/0013012 A1* | 1/2021 | Sawachi | C23C 16/45561 |
| 2021/0020411 A1* | 1/2021 | Savas | H01J 37/32899 |
| 2021/0051769 A1* | 2/2021 | Endo | H05H 1/46 |
| 2021/0059037 A1* | 2/2021 | Ye | H01J 37/32128 |
| 2021/0082667 A1* | 3/2021 | Zhao | H01L 21/31116 |
| 2021/0118649 A1* | 4/2021 | Huh | H01J 37/32183 |
| 2021/0142986 A1* | 5/2021 | Bhutta | H01L 21/67069 |
| 2021/0183630 A1* | 6/2021 | Jindo | H05H 1/3405 |
| 2021/0202211 A1* | 7/2021 | Morii | H01J 37/32183 |
| 2021/0217587 A1* | 7/2021 | Savas | C23C 16/52 |
| 2021/0217588 A1* | 7/2021 | Savas | H01J 37/3299 |
| 2021/0217590 A1* | 7/2021 | Savas | H01J 37/32944 |
| 2021/0265143 A1* | 8/2021 | Endo | H01L 21/6833 |
| 2021/0287880 A1* | 9/2021 | Van Zyl | H01J 37/32045 |
| 2021/0327684 A1* | 10/2021 | Bhutta | H01L 21/02274 |
| 2021/0366692 A1* | 11/2021 | Yamada | H01L 21/67103 |
| 2021/0375602 A1* | 12/2021 | Sasagawa | H01L 21/0337 |
| 2022/0208520 A1* | 6/2022 | Zhang | H03H 7/40 |
| 2022/0254617 A1* | 8/2022 | Hirano | H01J 37/32981 |

* cited by examiner

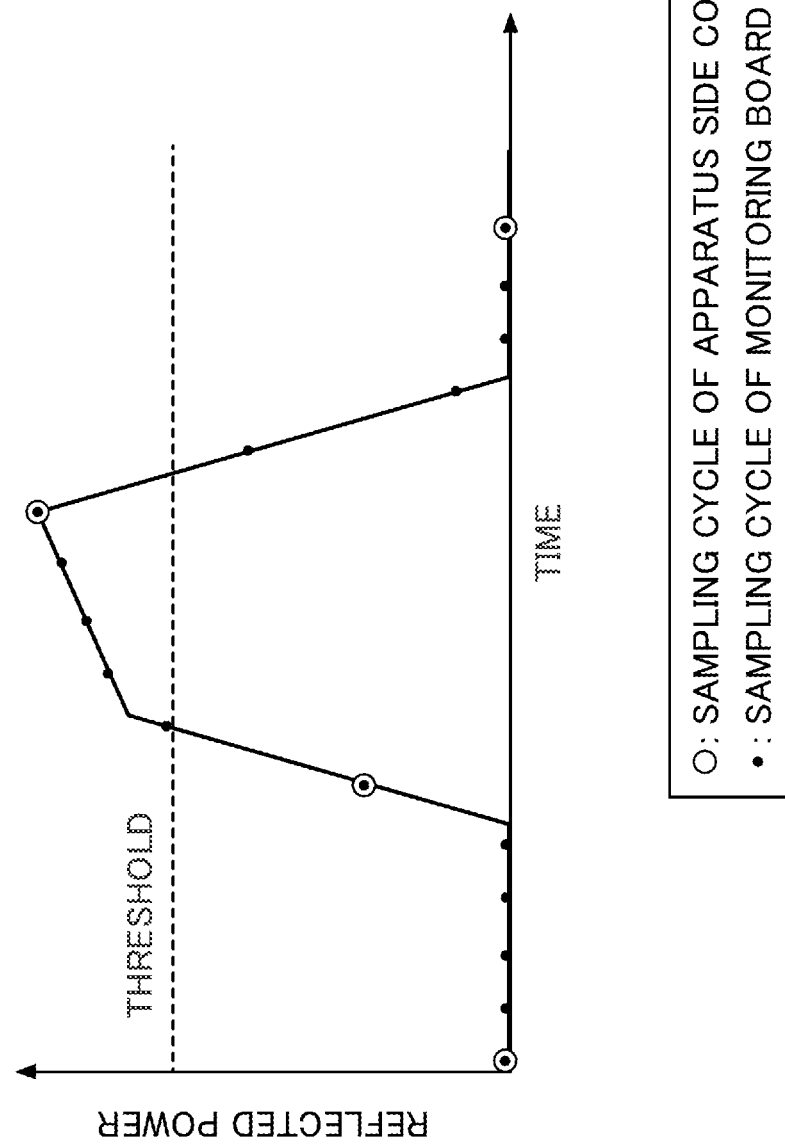

PLASMA PROCESSING APPARATUS AND MONITORING DEVICE

CROSS-REFERENCE TO RELATED APPLICATION

The present application claims priority under 35 U.S.C. § 119 to Japanese Patent Application No. 2021-019646, filed Feb. 10, 2021. The contents of which are incorporated herein by reference in their entirety.

BACKGROUND OF THE INVENTION

1. Field of the Invention

The disclosures herein generally relate to a plasma processing apparatus and a monitoring device.

2. Description of the Related Art

Conventionally, monitoring devices and monitoring methods for detecting occurrences of abnormal discharges in plasma processing apparatuses have been known (see, for example, Japanese Unexamined Patent Application Publication No. 2003-234332). Also, apparatuses for suppressing occurrences of abnormal discharges in vacuum devices that generate plasma by supplying electric power from radio frequency power source devices to plasma reaction chambers have been known (see, for example, WO 2009/118920).

SUMMARY OF THE INVENTION

Problem to be Solved by the Invention

The present disclosure provides a technique for reducing time from an occurrence of an abnormality in a chamber of a plasma processing apparatus to control of a monitoring target.

Means for Solving the Problem

According to an aspect of the present disclosure, a plasma processing apparatus includes a chamber; an apparatus-side controller configured to control plasma processing in the chamber; and a monitoring unit configured to monitor a monitoring target that is disposed within the chamber, or is connected directly or indirectly to the chamber. The apparatus-side controller sets the monitoring target and a timing at which monitoring target information is to be acquired. The monitoring unit acquires the monitoring target information transmitted from the monitoring target to the apparatus-side controller, detects an occurrence of an abnormality in the chamber based on the monitoring target information, and controls the monitoring target for the chamber in which the abnormality occurs.

Effects of the Invention

According to the disclosure of the present application, the time from the occurrence of an abnormality in the chamber of the plasma processing apparatus to the control of the monitoring target can be reduced.

BRIEF DESCRIPTION OF DRAWINGS

FIG. 8 is a diagram illustrating an example of a timing of detecting an occurrence of an abnormal discharge using the monitoring board.

DESCRIPTION OF THE PREFERRED EMBODIMENTS

Hereinafter, embodiments for carrying out the present invention will be described with reference to the drawings. The plasma processing apparatus according to the embodiment of the present application is used in a step of manufacturing process of semiconductors, such as deposition, etching, or asking. In a processing using plasma, radio frequency electric power is supplied from a radio frequency power source to a vacuum chamber (processing chamber) to convert a processing gas into plasma and cause the gas to react with a surface of a substrate, which is a processing target, and thereby the desired processing is performed. A plasma processing apparatus is used in manufacturing process for semiconductor devices, liquid crystal panels, or the like.

In the plasma processing apparatus that performs processing using plasma, abnormality in a plasma processing space, such as abnormal discharge, may occur due to various factors. When the abnormality occurs, the processing of the substrate, which is the processing target in the plasma processing apparatus, may malfunction. Therefore, in the plasma processing apparatus according to the embodiment of the present application, time from the occurrence of the abnormality in the plasma processing space to supply stopping of the electric power to the plasma processing space (interlocking) is reduced as described below. For example, a deposition apparatus and an etching apparatus are examples of the plasma processing apparatus.

<System Configuration>

Figure 1:
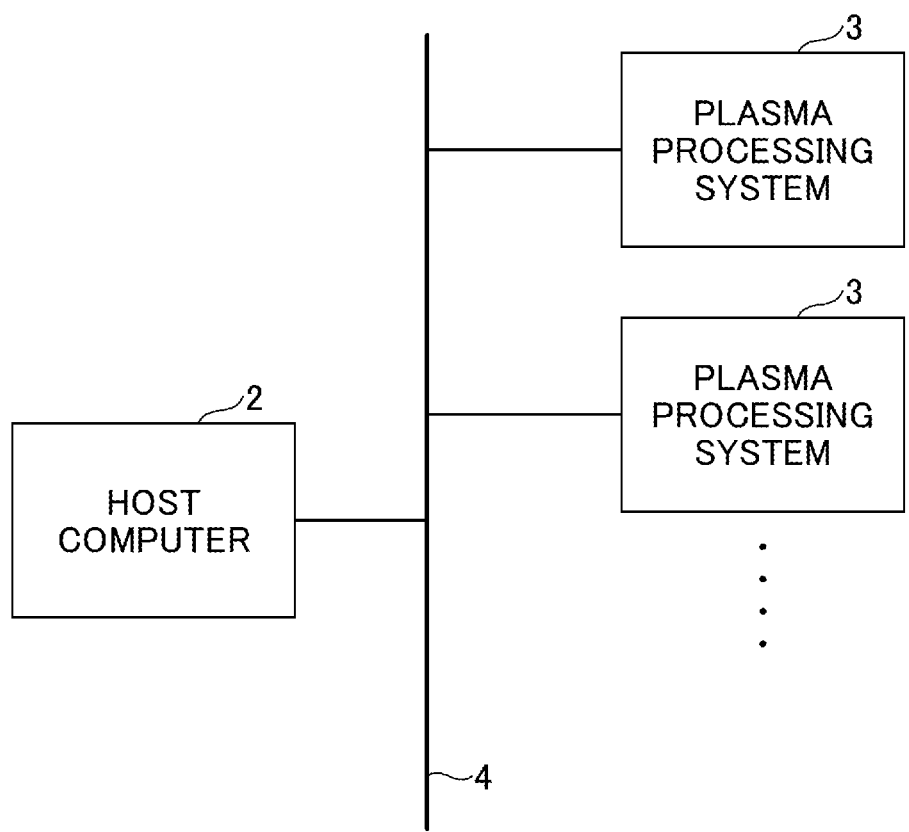
FIG. 1 is a diagram illustrating an example of a configuration of a semiconductor manufacturing system according to an embodiment of the present application.

FIG. 1 is a diagram illustrating an example of a configuration of a semiconductor manufacturing system according to the embodiment of the present application. In the semiconductor manufacturing system 1 illustrated in FIG. 1, a host computer 2 and a plasma processing system 3 or two or more plasma processing systems 3 are connected via a data communicable network 4 capable of data communication, such as a local area network (LAN).

The host computer 2 is an example of a man-machine interface (MMI) that provides information regarding the plasma processing system 3 to an operator who is an example of a user. The host computer 2 accepts a parameter setting from the operator. The host computer 2 accepts a recipe setting, such as a processing recipe, a maintenance recipe, or an acceptable recipe from the operator. The host computer 2 provides the parameter setting and the recipe setting to the plasma processing system 3.

In accordance with a job execution request from the host computer 2, the plasma processing system 3 transfers a substrate, which is a processing target, to a plasma processing space for performing desired processing using plasma, and performs the desired processing (deposition, etching, asking, or the like) using plasma in the plasma processing space.

Further, the semiconductor manufacturing system 1 shown in FIG. 1 is an example, and it is obvious that there are various system configurations depending on the application or the purpose. Classification of apparatus, such as the host computer 2 and the plasma processing system 3 illustrated in FIG. 1, is an example.

For example, the semiconductor manufacturing system 1 may have a variety of configurations, such as a configuration, in which the host computer 2 and the plasma processing system 3 are integrated, or a configuration, in which the host computer 2 or the plasma processing system 3 is further divided. The host computer 2 may be capable of controlling a plurality of plasma processing systems 3 as a whole, such as the semiconductor manufacturing system 1 illustrated in FIG. 1, or may be provided in one-to-one correspondence with the plasma processing system 3.

<Configuration of Plasma Processing System>

The plasma processing system 3 according to the embodiment of the present application includes a plasma processing apparatus 5, a controller 6, and a monitoring unit 7. The plasma processing apparatus 5 includes a plasma processing chamber 10, a substrate support part 11 and a plasma generation unit 12. The plasma processing chamber 10 has a plasma processing space. Furthermore, the plasma processing chamber 10 has at least one gas supply port for supplying at least one processing gas to the plasma processing space, and at least one gas discharge port for discharging gas from the plasma processing space. The gas supply port is connected to a gas supply unit 20, which will be described later, and the gas discharge port is connected to an exhaust system 40, which will be described later. The substrate support part 11 is disposed in a plasma processing space and has a substrate support surface for supporting a substrate.

The plasma generation unit 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), a surface wave plasma (SWP), or the like. Various types of plasma generation units, each including an alternating current (AC) plasma generation unit and a direct current (DC) plasma generation unit, may be used. In the embodiment of the present application, the AC signal (AC power) used in the AC plasma generation unit has a frequency of from 100 kHz to 10 GHz. Accordingly, the AC signal includes a radio frequency (RF) signal and a microwave signal. In the embodiment of the present application, the RF signal has a frequency of from 200 kHz to 150 MHz.

The controller 6 performs processing of computer-executable instructions that cause the plasma processing apparatus 5 to perform various processes described in the present disclosure. The controller 6 may be configured to control elements of the plasma processing apparatus 5 to perform the various processes described below. In the present embodiment, a part or a whole of the controller 6 may be included in the plasma processing apparatus 5. The controller 6 may include, for example, a computer 6a. The computer 6a may include, for example, a central processing unit (CPU) 6a1, a storage unit 6a2, and a communication interface 6a3. The processing unit 6a1 may be configured to perform various control operations based on a program stored in the storage unit 6a2. The storage unit 6a2 may include a random-access memory (RAM), a read only memory (ROM), a hard disk drive (HDD), a solid-state drive (SSD), or a combination of these. The communication interface 6a3 may communicate with the plasma processing apparatus 5 via a communication line such as a local area network (LAN). Furthermore, the communication interface 6a3 is provided with a control network master 105 and an intra-apparatus communication port 106, which will be described later. The control network master 105 is a master communication unit for a control network, such as a device net master. The control network is an example of a network that connects, in a communicable manner, a host, such as the controller 6, and a client, such as a power source 30 or a flow controller 22, with each other. The intra-apparatus communication port 106 is an example of a communication port for connecting the controller 6 and the monitoring unit 7, in a communicable manner.

Hereinafter, an example of a configuration of a capacitively coupled plasma processing apparatus as an example of the plasma processing apparatus 5 will be described.

The capacitively coupled plasma processing apparatus 5 includes a plasma processing chamber 10, a gas supply unit 20, a power source 30 and an exhaust system 40. Furthermore, the plasma processing apparatus 5 includes a substrate support part 11 and a gas inlet part. The gas inlet part is configured to introduce at least one processing gas into the plasma processing chamber 10. The gas inlet part includes a showerhead 13. The substrate support part 11 is disposed within the plasma processing chamber 10. The showerhead 13 is disposed above the substrate support part 11. In the embodiment of the present application, the showerhead 13 forms at least a portion of a ceiling of the plasma processing chamber 10. The plasma processing chamber 10 has a plasma processing space 10s defined by a showerhead 13, a sidewall 10a of the plasma processing chamber 10, and the substrate support part 11. The sidewall 10a is grounded. The showerhead 13 and substrate support part 11 are electrically isolated from a casing of the plasma processing chamber 10.

The substrate support part 11 includes a main body part 111 and a ring assembly 112. The main body part 111 has a central region (substrate support surface) 111a for supporting the substrate (wafer) W and an annular region (ring support surface) 111b for supporting the ring assembly 112. The annular region 111b of the main body part 111 surrounds the central region 111a of the main body part 111 in a plan view. The substrate W is disposed on the central region 111a of the main body part 111 and the ring assembly 112 is disposed on the annular region 111b of the main body part 111 to surround the substrate W on the central region 111a of the main body part 111. In the embodiment of the present application, the main body part 111 includes a base and an electrostatic chuck. The base includes an electrically conductive member. The electrically conductive member of the base serves as a lower electrode. The electrostatic chuck is placed on the base. The top surface of the electrostatic chuck has a substrate support surface 111a. The ring assembly 112 includes one or more annular members. At least one of the one or more annular members is an edge ring. Furthermore, although not shown, the substrate support part 11 may include a temperature control module configured to adjust, to a target temperature, a temperature of the electrostatic chuck, the ring assembly 112, or the substrate, or any combination thereof. The temperature control module may include a heater, a heat transfer medium, a flow path, or a combination thereof. A heat transfer fluid, such as brine or gas, flows through the flow path. The substrate support part 11 may also include a heat transfer gas supply unit configured to supply a heat transfer gas to a space between a back surface of the substrate W and the substrate support surface 111*a*.

The showerhead 13 is configured to introduce at least one processing gas from the gas supply unit 20 into the plasma processing space 10*s*. The showerhead 13 has at least one gas supply port 13*a*, at least one gas diffusion chamber 13*b*, and a plurality of gas introduction ports 13*c*. Processing gas supplied to the gas supply port 13*a* is introduced into the plasma processing space 10*s* from the plurality of gas introduction ports 13*c* through the gas diffusion chamber 13*b*. Furthermore, the showerhead 13 includes an electrically conductive member. The conductive member of the showerhead 13 serves as an upper electrode. The gas inlet part may include, in addition to the showerhead 13, one or more side gas injectors (SGI) attached to one or more openings formed in the sidewall 10*a*.

The gas supply unit 20 may include at least one gas source 21 and at least one flow controller 22. In the embodiment of the present application, the gas supply unit 20 is configured to supply at least one processing gas from the corresponding gas source 21 to the showerhead 13 via the corresponding flow controller 22. Each flow controller 22 may include, for example, a mass flow controller or a pressure control type flow controller. Furthermore, the gas supply unit 20 may include at least one flow rate modulation device that modulates or pulses the flow rate of at least one processing gas.

The power source 30 includes an RF power source 31 coupled to the plasma processing chamber 10 via at least one impedance matching circuit. The RF power source 31 is configured to provide at least one RF signal (RF power), such as a source RF signal or a bias RF signal, to the conductive member of the substrate support part 11, the conductive member of the showerhead 13, or both. Thus, a plasma is formed from at least one processing gas supplied to the plasma processing space 10*s*. Accordingly, the RF power source 31 may function as at least a part of the plasma generation unit 12. In addition, when the bias RF signal is supplied to the conductive member of the substrate support part 11, a bias potential is generated in the substrate W, and an ion component in the formed plasma can be drawn into the substrate W.

In the embodiment, the RF power source 31 includes a first RF generation unit 31*a* and a second RF generation unit 31*b*. The first RF generation unit 31*a* is coupled to the conductive member of the substrate support part 11, the conductive member of the showerhead 13, or both via at least one impedance matching circuit, and is configured to generate a source RF signal (source RF power) for generating plasma. In the embodiment, the source RF signal has a frequency of from 13 MHz to 150 MHz. In the embodiment, the first RF generation unit 31*a* may be configured to generate a plurality of source RF signals having different frequencies. The generated one or more source RF signals are supplied to the conductive member of the substrate support part 11, the conductive member of the showerhead 13, or both. The second RF generation unit 31*b* is coupled to the conductive member of the substrate support part 11 via at least one impedance matching circuit, and is configured to generate a bias RF signal (bias RF power). In the embodiment, the bias RF signal has a lower frequency than that of the source RF signal. In the embodiment, the bias RF signal has a frequency of from 400 kHz to 13.56 MHz. In the embodiment, the second RF generation unit 31*b* may be configured to generate a plurality of bias RF signals having different frequencies. The generated one or more bias RF signals are supplied to the conductive member of the substrate support part 11. In various embodiments, the source RF signal, the bias RF signal, or both may be pulsed.

The power source 30 may also include a DC power source 32 coupled to the plasma processing chamber 10. The DC power source 32 includes a first DC generation unit 32*a* and a second DC generation unit 32*b*. In the embodiment of the present application, the first DC generation unit 32*a* is connected to the conductive member of the substrate support part 11, and is configured to generate a first DC signal. The generated first DC signal is applied to the conductive member of the substrate support part 11. In the embodiment, the first DC signal may be applied to other electrodes, such as an electrode in the electrostatic chuck. In the embodiment, the second DC generation unit 32*b* is connected to the conductive member of the showerhead 13, and is configured to generate a second DC signal. The generated second DC signal is applied to the conductive member of the showerhead 13. In various embodiments, the first DC signal and the second DC signal may be pulsed. The first and second DC generation units 32*a* and 32*b* may be provided in addition to the RF power source 31, or the first DC generation unit 32*a* may be provided in lieu of the second RF generation unit 31*b*.

The exhaust system 40 may be connected, for example, to a gas exhaust port 10*e* provided at the bottom of the plasma processing chamber 10. The exhaust system 40 may include a pressure regulation valve and a vacuum pump. The pressure regulation valve regulates a pressure in the plasma processing space 10*s*. The vacuum pump may include a turbomolecular pump, a dry pump, or a combination thereof.

Figure 4:
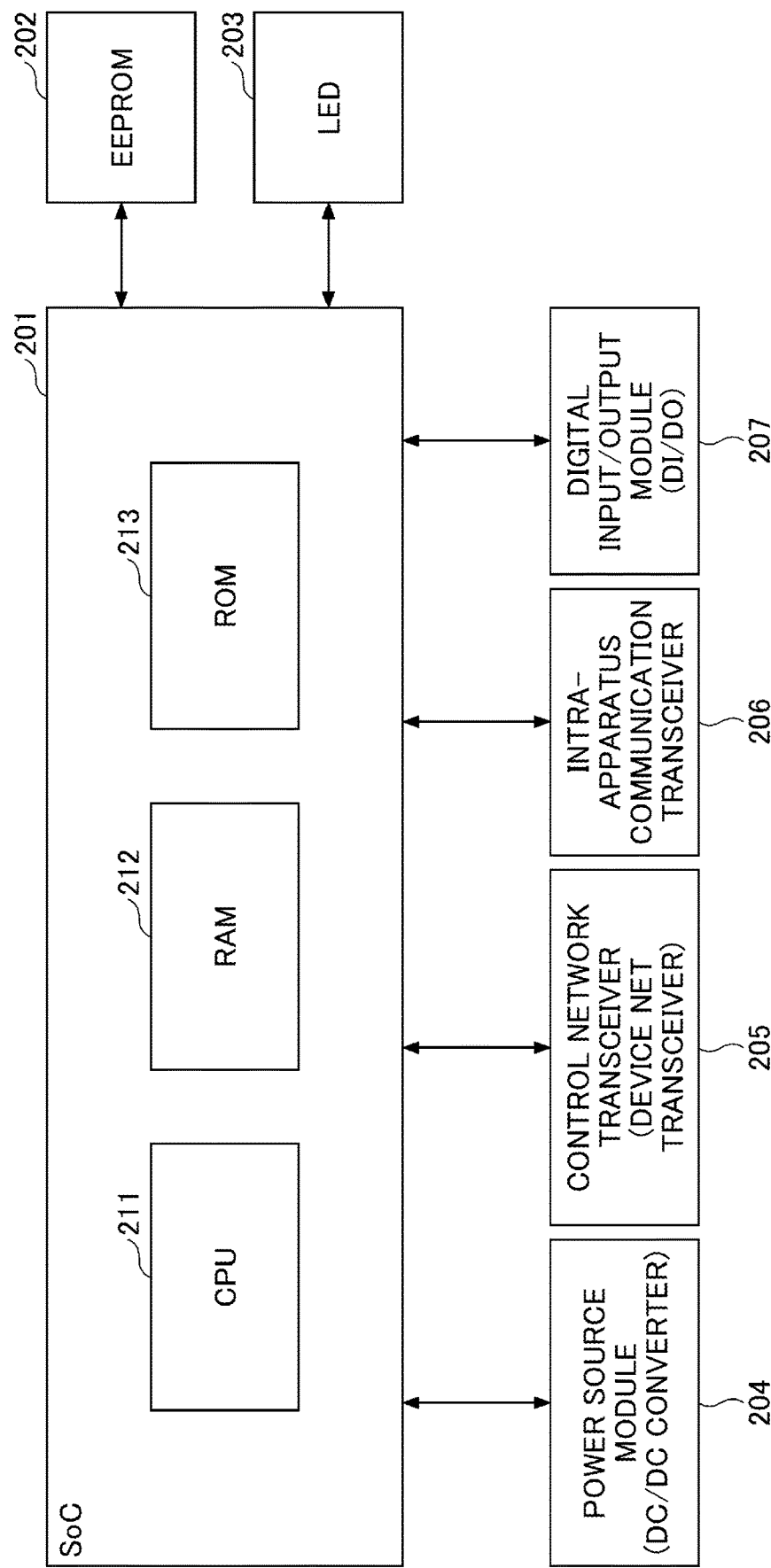
FIG. 4 is a diagram illustrating an example of a hardware configuration of a monitoring board.

The monitoring unit 7 is realized, for example, by the monitoring board 70 having the configuration illustrated in FIG. 4. For example, the monitoring board 70 is a computer having the configuration illustrated in FIG. 4. As will be described later, when monitoring target information (e.g., reflected power) of the monitoring target (e.g., power source 30) is monitored and the monitoring target information satisfies a set condition (e.g., the reflected power is greater than or equal to a threshold), set processing is performed (controlling to stop supplying electric power to the plasma processing space, or the like).

FIG. 4 is a diagram illustrating an example of a hardware configuration of the monitoring board. The monitoring board 70 in FIG. 4 includes an SoC (System on a chip) 201, an EEPROM (Electrically Erasable Programmable ROM) 202, an LED (light emitting diode) 203, a power source module 204, a control network transceiver 205, an intra-apparatus communication transceiver 206, and a digital I/O module 207.

The SoC 201 incorporates a CPU 211, a RAM 212, and a ROM 213. The EEPROM 202 is an example of a non-volatile memory. The CPU 211 uses the RAM 212 as a working area and performs processing of the monitoring board 70 as described below based on a program and data read from the ROM 213 or the EEPROM 202.

The power source module 204 supplies electric power to the SoC 201. The control network transceiver 205 receives data transferred between a client and a host in a control network such as a Device net master. The intra-apparatus communication transceiver 206 is an example of a communication transceiver connecting the controller 6 and the monitoring board 70 in a communicable manner. The digital I/O module 207 is an example of a communication port that outputs a digital signal to a client, such as the power source 30 or the flow controller 22.

The LED 203 indicates a state of the monitoring board 70 by turning ON, blinking, and turning OFF. For example, the LED 203 indicates a state of a start-up of the CPU 211, writing of set data (WRITE), reading of set data (READ), an occurrence of abnormality, or the like.

Figure 2:
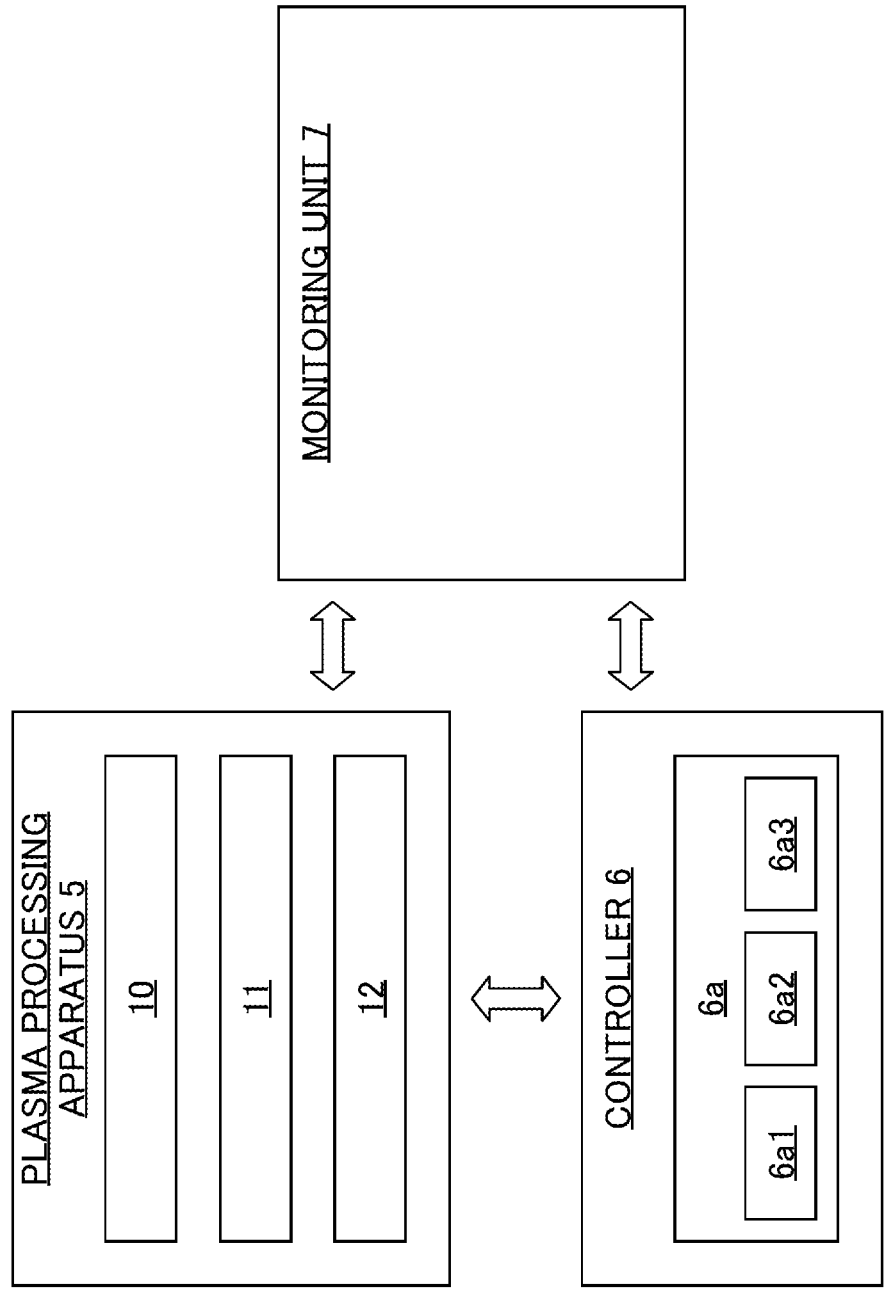
FIG. 2 is a diagram illustrating an example of a configuration of a plasma processing system according to the embodiment of the present application.
Figure 3:
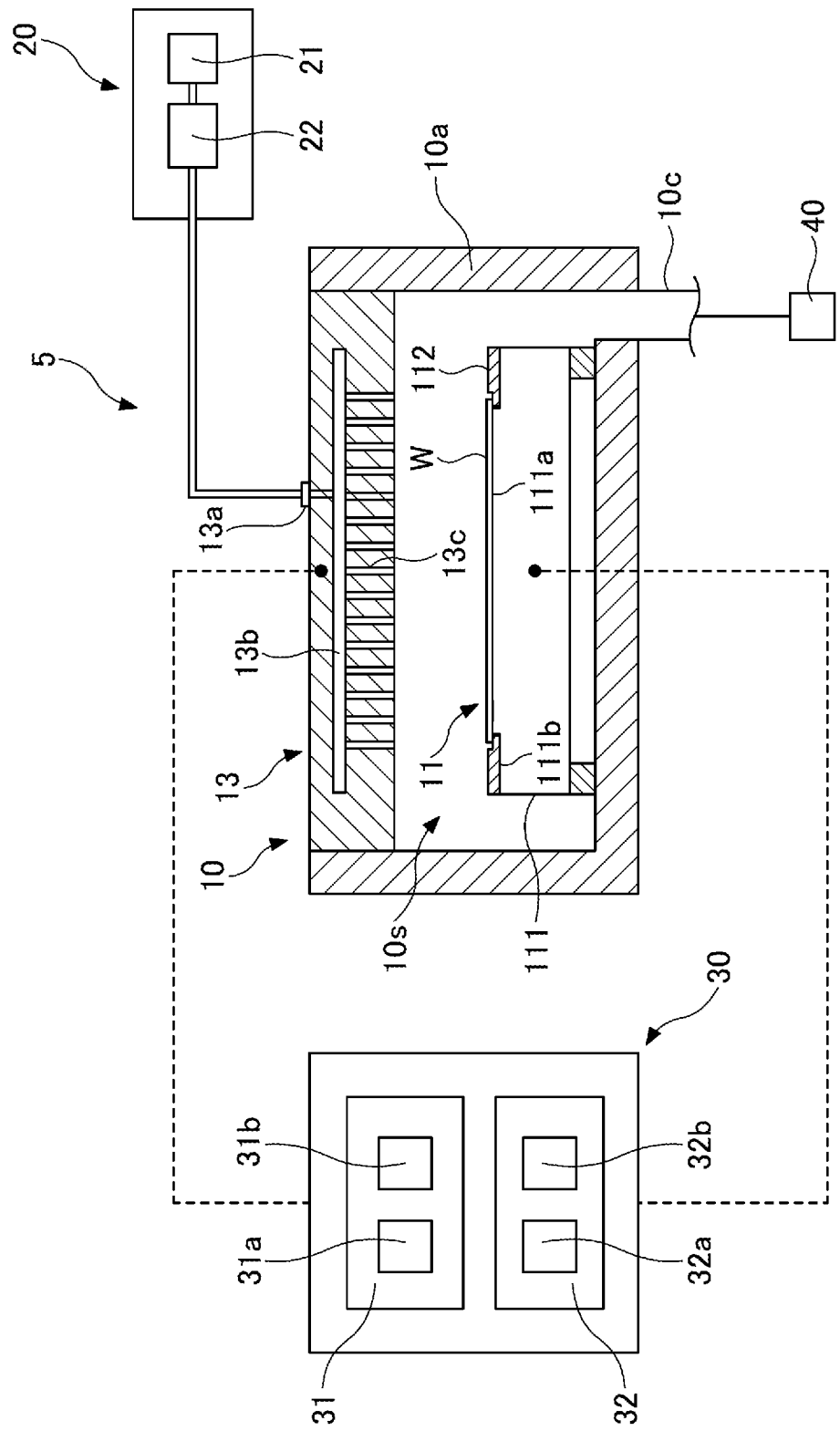
FIG. 3 is a diagram illustrating an example of a configuration of a plasma processing apparatus according to the embodiment of the present application.
Figure 5:
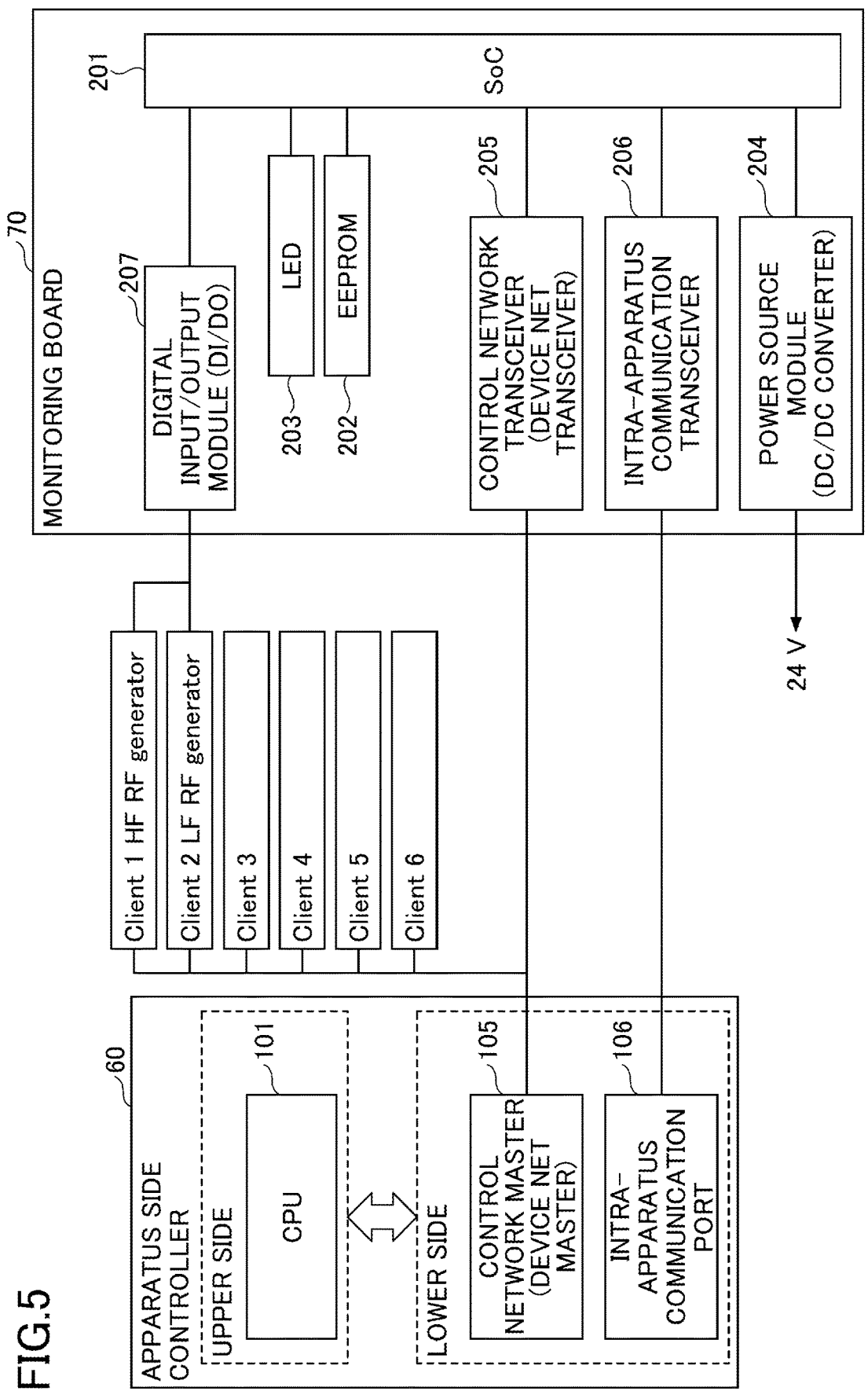
FIG. 5 is a diagram illustrating an example of connections among an apparatus-side controller, the monitoring board, and a client of a control network.

FIG. 5 is a diagram illustrating an example of a configuration of connections among the client of the control network, such as the power source 30 and the flow controller 22 illustrated in FIG. 2, the apparatus-side controller 60 as an example of the controller 6, and the monitoring board 70.

FIG. 5 describes an example of the connections among the apparatus-side controller, the monitoring board, and the client of the control network. In FIG. 5, a configuration not used for the present description is omitted.

The apparatus-side controller 60 of the control network includes the CPU 101 at an upstream side, the control network master 105 at a downstream side, and the intra-apparatus communication port 106. The apparatus-side controller 60 uses the control network master 105 to perform data transfer by polling with the client such as the power source 30 or the flow controller 22. The CPU 101 at the upstream side of the apparatus-side controller 60 acquires data transferred from the client, such as the power source 30 or the flow controller 22, by polling with the control network master 105 at the downstream side.

Although not shown in FIG. 5, the CPU 101 of the apparatus-side controller 60 has a lot of polling targets. Therefore, a polling period between the CPU 101 and the control network master 105 is longer than a polling period between the control network master 105 and the client, such as the power source 30 or the flow controller 22.

In order to detect an occurrence of an abnormality, such as an abnormal discharge in the plasma processing space, and to stop the supply of electric power to the plasma processing space, it is necessary to determine whether an abnormality, such as an abnormal discharge, has occurred from data (monitoring target information) obtained by polling from a client of the monitoring target, such as the power source 30. An abnormal discharge, for example, causes the impedance of the plasma processing space to change, thereby increasing a reflected power to the client, such as the power source 30. The occurrence of an abnormal discharge in the plasma processing space can be detected by monitoring the reflected power. In the present embodiment, the monitored client, such as the power source 30, is assumed to have a function for measuring the reflected power. The client, such as the power source 30, may utilize a reflected power measurement function provided by the member other than the client.

Upon detection, by the CPU 101 of the apparatus-side controller 60, or the occurrence of an abnormal discharge in the plasma processing space, the CPU 101 recognizes a reflected power during a polling period between the CPU 101 and the control network master 105. As described above, upon detection, by the CPU 101 of the apparatus-side controller 60, of the occurrence of an abnormal discharge in the plasma processing space, the occurrence of an abnormal discharge in the plasma processing space is detected during the polling period between the CPU 101 and the control network master 105.

In contrast, the polling period between the control network master 105 and the monitored client, such as the power source 30, is shorter than the polling period between the CPU 101 and the control network master 105.

Accordingly, in the present embodiment, in the control network, the monitoring board 70 is disposed at a position where information (reflected power information) representing a value of the reflected power transmitted by polling between the client of the monitoring target, such as the power source 30, and the control network master 105, as the host, can be received. The reflected power information is an example of the monitoring target information.

Since the monitoring board 70 can receive data transferred between the client and the host in the control network, the reflected power information can be received more quickly than by the CPU 101 of the apparatus-side controller 60 by the difference in the polling periods. Thus, the monitoring board 70 can recognize reflected power in the polling period between the client and the host, and detect the occurrence of an abnormal discharge in the plasma processing space faster than the CPU 101 of the apparatus-side controller 60.

The SoC 201 detects the occurrence of an abnormality such as an abnormal discharge in the plasma processing space based on the monitoring target information such as the reflected power information received by the control network transceiver 205, as described below. Settings, such as the monitoring target of the monitoring board 70, a value of the monitoring target that is the monitoring target information, a monitoring timing, and a threshold for detecting the occurrence of an abnormality in the plasma processing space based on the value of the monitoring target, are performed between the intra-apparatus communication port 106 of the apparatus-side controller 60 and the intra-apparatus communication transceiver 206 of the monitoring board 70. For example, upon detection of the occurrence of an abnormal discharge in the plasma processing space based on the reflected power information, the monitoring timing is set to exclude a timing at which the occurrence of an abnormal discharge is not necessary to be detected, such as a timing when the value of the reflected power increases due to factors other than the occurrence of the abnormal discharge.

The SoC 201 monitors the value of the monitoring target at a set monitoring timing, and controls the monitoring target through the digital I/O module 207 when the condition is met. For example, if the value of reflected power recognized at the set monitoring timing is greater than or equal to a threshold, the SoC 201 controls the power source 30 that is the monitoring target through the digital I/O module 207 and stops supplying electric power from the power source 30 to the plasma processing space. The SoC 201 monitors the value of the monitoring target at the set monitoring timing, and when the condition is met, the SoC 201 may transfer log information before, after, or both the timing, at which the condition is met, between the intra-apparatus communication port 106 of the apparatus-side controller 60 and the intra-apparatus communication transceiver 206 of the monitoring board 70.

As shown in FIG. 5, the control network master 105 of the apparatus-side controller 60 and the control network transceiver 205 of the monitoring board 70 are connected to each other through a control network which is an example of a first communication unit. The intra-apparatus communication port 106 of the apparatus-side controller 60 and the communication transceiver 206 of the monitoring board 70 are connected through a communication network which is an example of a second communication unit different from the first communication unit. In the control network, a load is always generated by polling communication. Accordingly, the apparatus-side controller 60 sets the monitoring target of the monitoring board 70, the value of the monitoring target that is the monitoring target information, and the monitoring timing with respect to the monitoring board 70 through the communication network that is an example of the second communication unit, to suppress an increase in an amount of communication traffic on the control network side.

Figure 6:
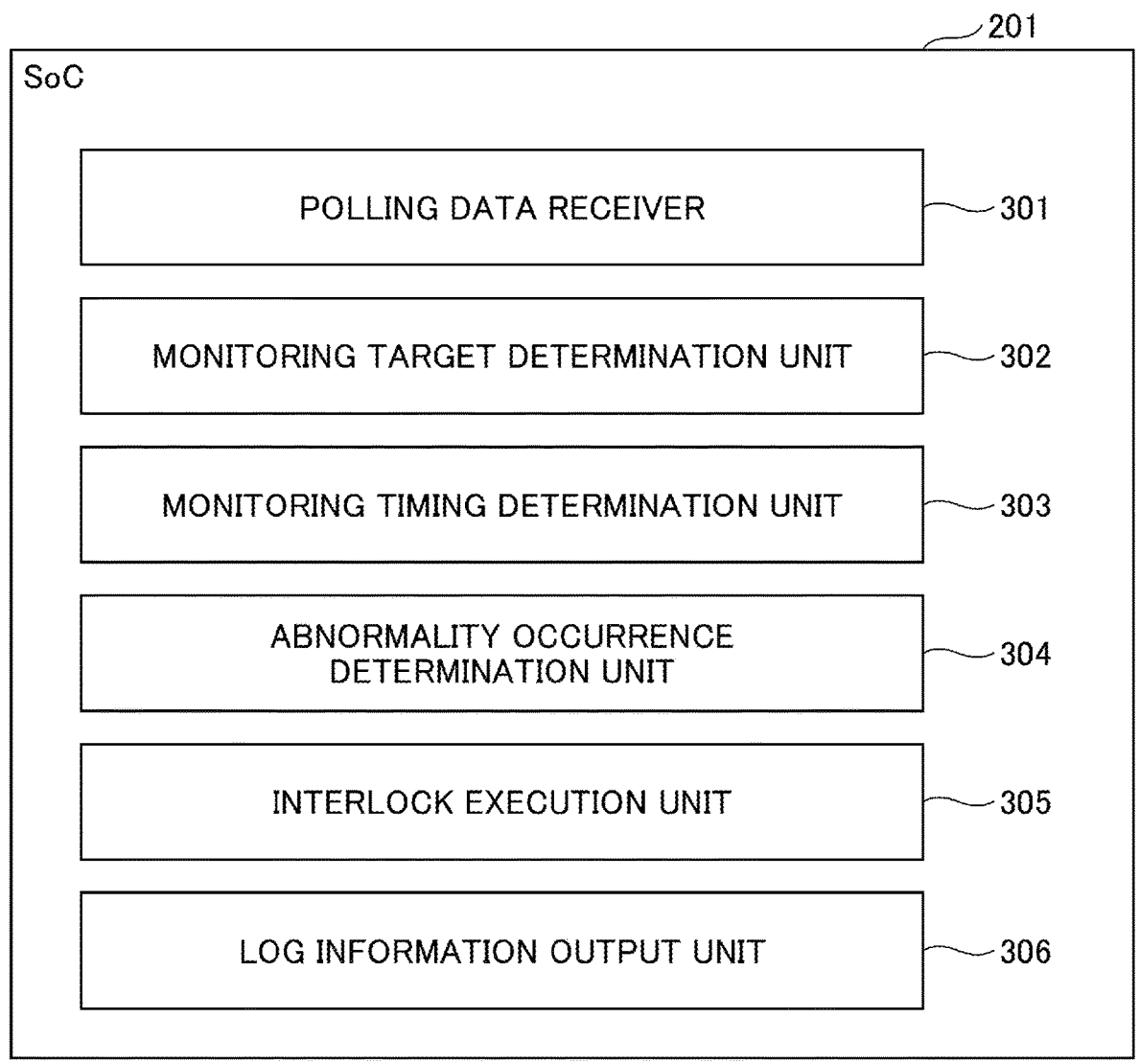
FIG. 6 is a diagram illustrating an example of a functional block of an SoC.

FIG. 6 is a functional block diagram illustrating an example of the SoC. The SoC 201 includes a polling data receiver 301, a monitoring target determination unit 302, a monitoring timing determination unit 303, an abnormality occurrence determination unit 304, an interlock execution unit 305, and a log information output unit 306. In the following, among the functions of the SoC 201, a function which is not used for the description in the present embodiment is not shown and an explanation thereof is omitted.

The polling data receiver 301 receives polling data transmitted between the control network master 105 of the apparatus-side controller 60 and the client such as the power source 30 or the flow controller 22. The monitoring target determination unit 302 determines whether the polling data received by the polling data receiver 301 is polling data from the client of the monitoring target. The monitoring timing determination unit 303 determines whether the timing is a timing to monitor the polling data from the client of the monitoring target.

If the polling data received by the polling data receiver 301 is polling data from the client of the monitoring target, and the timing is a timing of monitoring the polling data, the abnormality occurrence determination unit 304 detects an occurrence of abnormality based on the polling data.

For example, if the received polling data is a value of reflected power polled from the power source 30, which is the monitoring target, and the timing is a timing of monitoring the value of the reflected power of the polling data, the abnormality occurrence determination unit 304 detects an occurrence of an abnormal discharge based on the value of the reflected power.

The interlock execution unit 305 performs, for example, an interlock for the plasma processing apparatus 5 upon detection, by the abnormality occurrence determination unit 304, of an occurrence of abnormality. For example, the interlock execution unit 305 performs an interlock to stop supplying electric power to the plasma processing space upon detection, by the abnormality occurrence determination unit 304, of an abnormal discharge. Upon detection by the abnormality occurrence determination unit 304, of the occurrence of the abnormality, the log information output unit 306 outputs log information before, after, or both the timing where the occurrence of abnormality is detected through the intra-apparatus communication transceiver 206 to the apparatus-side controller 60.

<Operation of Monitoring Board>

Figure 7:
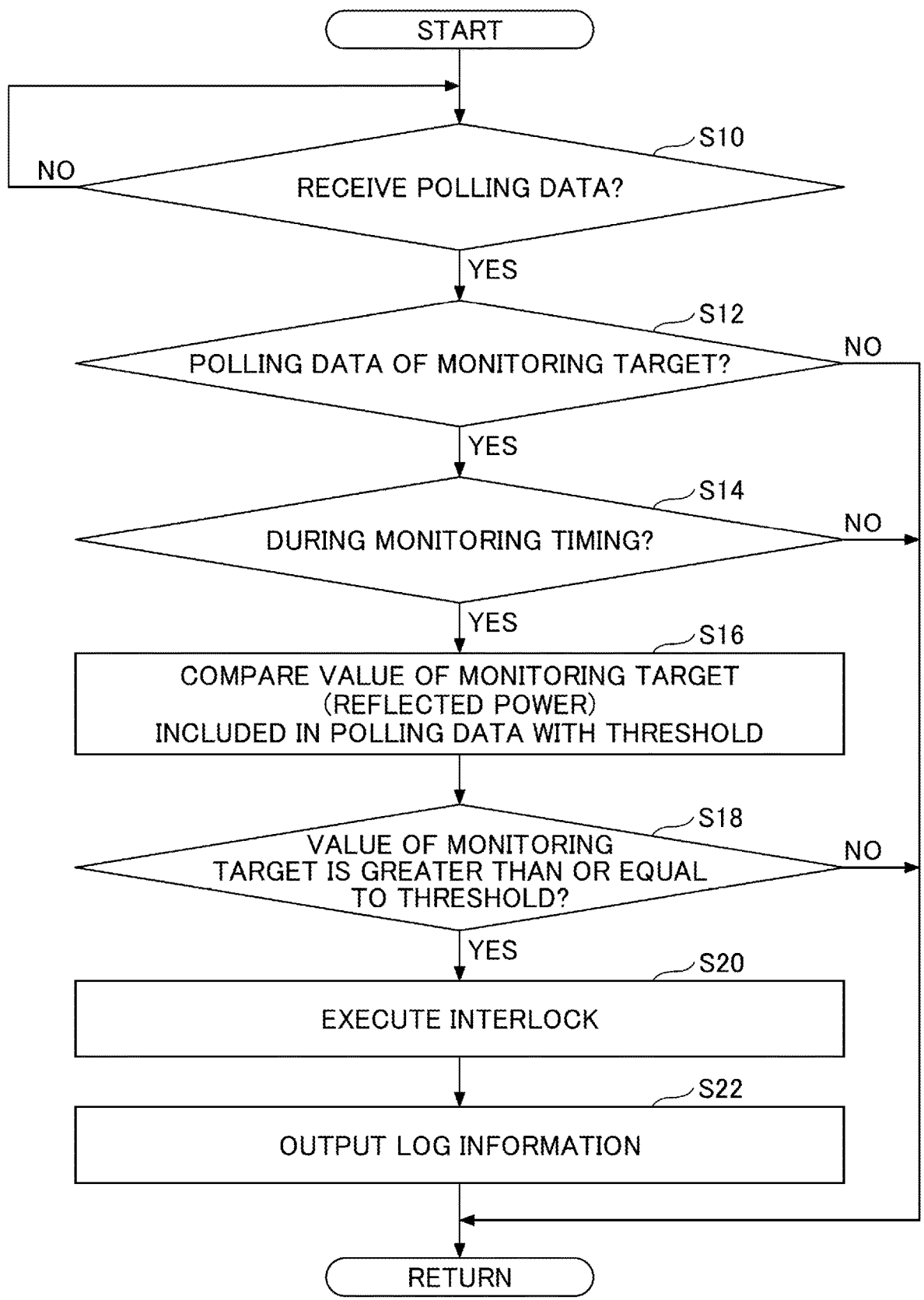
FIG. 7 is a flowchart illustrating an example of an operation of the monitoring board according to the embodiment of the present application.

Next, operation of the monitoring board 70 will be briefly described. FIG. 7 is a flowchart illustrating an example of an operation of the monitoring board according to the present embodiment.

The monitoring board 70 repeats a process of step S10 until receiving polling data transmitted between the control network master 105 of the apparatus-side controller 60 and the client such as the power source 30 or the flow controller 22.

When the polling data transmitted between the control network master 105 of the apparatus-side controller 60 and the client are received, the monitoring board 70 determines, in step S12, whether the polling data are polling data of the monitoring target. If the polling data are not polling data of the monitoring target, the process of the monitoring board 70 returns to step S10.

If the polling data are polling data of the monitoring target, the monitoring board 70 performs the process in step S14. In step S14, the monitoring board 70 determines whether the timing is a timing to monitor polling data from the client. If the timing is not a timing to monitor polling data from the client, the process of the monitoring board 70 returns to step S10.

If the timing is a timing to monitor polling data from the client, the monitoring board 70 performs the process of step S16. In step S16, the monitoring board 70 compares a value of the monitoring target (e.g., reflected power) included in the polling data with a threshold.

In step S18, if the value of the monitoring target included in the polling data is not greater than or equal to the threshold, the monitoring board 70 determines that an abnormality has not occurred, and the process returns to step S10. If the value of the monitoring target included in the polling data is greater than or equal to the threshold, the monitoring board 70 determines that an abnormality has occurred. For example, if the value of the reflected power that is the monitoring target in the polling data is greater than or equal to the threshold, the monitoring board 70 determines that an abnormal discharge has occurred.

When it is determined that an abnormality has occurred, the monitoring board 70 performs an interlock for the plasma processing apparatus 5 in step S20. For example, upon detection, by the monitoring board 70, of an abnormal discharge, the monitoring board 70 controls the power source 30 that is the monitoring target to stop supplying electric power to the plasma processing space.

In step S22, the monitoring board 70 outputs log information before, after, or both the timing at which the occurrence of the abnormality is detected to the apparatus-side controller 60 through the intra-apparatus communication transceiver 206.

For example, the timing of detecting the occurrence of the abnormal discharge in the case of detecting the occurrence of the abnormal discharge in the plasma processing space by the CPU 101 of the apparatus-side controller 60 is different from the timing in the case of detecting the occurrence of the abnormal discharge in the plasma processing space by the monitoring board 70, as shown in FIG. 8.

FIG. 8 is a diagram for explaining an example of the timing of detecting the occurrence of an abnormal discharge by the monitoring board. In FIG. 8, the value of reflected power for each period (sampling period of the apparatus-side controller) in which the reflected power can be recognized by the CPU 101 of the apparatus-side controller 60 is indicated by a large circle plot. In FIG. 8, the value of the reflected power for each period (sampling period of the monitoring board) in which the reflected power can be recognized by the monitoring board 70 is indicated by a small circle plot.

As shown by the plot of the sampling period of the monitoring board in FIG. 8, the monitoring board 70 can recognize that the reflected power has become greater than or equal to the threshold at the timing immediately after the reflected power exceeded the threshold.

The plot of the sampling period of the apparatus-side controller in FIG. 8 show that the CPU 101 of the apparatus-side controller 60 cannot recognize that the reflected power has become greater than or equal to the threshold until the lapse of 80 msec after the reflected power exceeded the threshold.

As described above, according to the monitoring board 70 of the embodiment of the present application, the monitoring board can perform the interlock in a shorter time than that of the CPU 101 of the apparatus-side controller 60.

For example, the monitoring board 70 according to the present embodiment can detect the occurrence of an abnormal discharge in the plasma processing space faster than the CPU 101 of the apparatus-side controller 60 when the value of the monitoring target is the reflected power of the power source 30. Thus, for example, the monitoring board 70 according to the present embodiment can reduce the time from the occurrence of an abnormal discharge in the plasma processing space to stopping the supply of electric power to the plasma processing space, in the case where the value of the monitoring target is the reflected power of the power source 30.

Moreover, for example, the monitoring board 70 according to the present embodiment can detect an occurrence of an abnormality in the processing gas in the plasma processing space faster than the CPU 101 of the apparatus-side controller 60 in the case where the value of the monitoring target is a gas concentration in the plasma processing space. Accordingly, for example, the monitoring board 70 according to the present embodiment can reduce the time from the occurrence of an abnormality in the processing gas in the plasma processing space to adjusting the flow rate of the processing gas supplied to the plasma processing space, in the case where the value of the monitoring target is the gas concentration in the plasma processing space.

The value of the monitoring target is not limited to the reflected power and the gas concentration, but may include a value of a back pressure such as helium for detecting an occurrence of an abnormality in a wafer adsorption, a value of a current of a high voltage (HV) power source of an electrostatic chuck (ESC) for detecting the occurrence of the abnormality in the wafer adsorption, a value of an optical emission spectroscopy (OES) of a plasma for detecting the occurrence of an abnormality in a plasma, and the like.

As described above, preferred embodiments of the present invention have been described in detail. However, it should be noted that the present invention is not limited to the requirements shown in the embodiments. The embodiments can be modified and substituted without departing from the scope of the present invention, and can be appropriately defined according to its application.

APPENDIX

Appendix 1

A plasma processing apparatus including:
a chamber;
an apparatus-side controller configured to control plasma processing in the chamber; and
a monitoring unit configured to monitor a monitoring target that is disposed within the chamber, or is connected directly or indirectly to the chamber,
the apparatus-side controller setting the monitoring target and a timing at which monitoring target information is to be acquired, and
the monitoring unit acquiring the monitoring target information transmitted from the monitoring target to the apparatus-side controller, detecting an occurrence of an abnormality in the chamber based on the monitoring target information, and controlling the monitoring target for the chamber in which the abnormality occurs.

Appendix 2

The plasma processing apparatus according to the appendix 1,
the monitoring target being a radio frequency power source that supplies electric power to the chamber, and
the monitoring unit controlling the radio frequency power source to change an electric power supply with respect to the chamber in which the abnormality occurs.

Appendix 3

The plasma processing apparatus according to the appendix 2,
the changing of the electric power supply including stopping the electric power supply with respect to the chamber in which the abnormality occurs.

Appendix 4

The plasma processing apparatus according to the appendix 2,
the changing of the electric power supply including synchronizing an electric power supply signal of the radio frequency power source with respect to the chamber in which the abnormality occurs with other information.

Appendix 5

The plasma processing apparatus according to the appendix 2 further including:
a flow controller configured to control a flow rate of a gas supplied to the chamber,
the other information being information on a flow rate of the gas or information on a concentration of the gas.

Appendix 6

The plasma processing apparatus according to the appendix 1,
the monitoring target being the flow controller that controls the flow rate of a gas supplied to the chamber, and
the monitoring unit controlling the flow controller to change the flow rate of a gas with respect to the chamber in which the abnormality occurs.

Appendix 7

A plasma processing apparatus including:
a chamber;
an apparatus-side controller configured to control plasma processing in the chamber;
a radio frequency power source configured to supply electric power to the chamber; and
a monitoring unit configured to acquire monitoring target information transmitted from a monitoring target to the apparatus-side controller, detect an occurrence of an abnormality in the chamber based on the monitoring target information, and control the radio frequency power source to stop supplying electric power with respect to the chamber in which the abnormality occurs,
the apparatus-side controller setting, for the monitoring unit, the monitoring target and a timing at which the monitoring target information is to be acquired.

Appendix 8

The plasma processing apparatus according to the appendix 7, the apparatus-side controller setting, for the monitoring unit, a threshold for detecting the occurrence of the abnormality in the chamber based on the monitoring target information.

Appendix 9

The plasma processing apparatus according to the appendix 8,
the apparatus-side controller, the monitoring target, and the monitoring unit being connected by a first communication unit for transmitting data by polling,
the apparatus-side controller and the monitoring unit being connected to each other by a second communication unit different from the first communication unit in a communicable manner, and
the apparatus-side controller using the second communication unit, to set, for the monitoring unit, the monitoring target, the timing at which the monitoring target information is to be acquired, and the threshold.

Appendix 10

The plasma processing apparatus according to the appendix 9,
the first communication unit performing communication using a master communication unit and a client communication unit of a control network,
the apparatus-side controller including the master communication unit,
each of the monitoring target and the monitoring unit including the client communication unit, and
the monitoring unit acquiring the monitoring target information during a polling period in which the apparatus-side controller acquires the monitoring target information from the monitoring target.

Appendix 11

The plasma processing apparatus according to the appendix 9 or 10,
the monitoring unit using the second communication unit, to provide to the apparatus-side controller the monitoring target information at a timing where the occurrence of the abnormality is detected and the monitoring target information within a desired period before, after, or both the timing, as log information.

Appendix 12

The plasma processing apparatus according to any one of the appendices 7 to 10,
the monitoring unit detecting, as the occurrence of the abnormality in the chamber, an occurrence of an abnormal discharge based on reflected power information as the monitoring target information, an occurrence of a wafer adsorption abnormality based on gas back pressure information as the monitoring target information, an occurrence of the wafer adsorption abnormality based on current information of a high voltage power source of an electrostatic chuck as the monitoring target information, or an occurrence of a plasma abnormality based on optical emission spectroscopy information of the plasma as the monitoring target information, or any combination thereof.

Appendix 13

The plasma processing apparatus according to the appendix 12,
the apparatus-side controller setting, for the monitoring unit, a timing at which the reflected power information is to be acquired so as not to acquire the monitoring target information during a period in which an increase in reflected power is predicted by the plasma processing but to acquire the monitoring target information during a period in which an increase in reflected power is not predicted by the plasma processing.

Appendix 14

The plasma processing apparatus according to any one of the appendices 7 to 13 further including:
a flow controller configured to control a flow rate of a gas supplied to the chamber,
the monitoring unit controlling the flow controller to acquire gas concentration information of the chamber transmitted from the flow controller to the apparatus-side controller, detecting an occurrence of an abnormality of the gas in the chamber based on the gas concentration information, and adjusting the flow rate of the gas supplied with respect to the chamber in which the abnormality occurs, and
the apparatus-side controller setting, for the monitoring unit, the flow controller of the monitoring target, a timing at which the gas concentration information is to be acquired, and a threshold for detecting the occurrence of an abnormality in the gas.

Appendix 15

A monitoring device for suppressing abnormal discharge of a plasma processing apparatus including:
a setting receiver configured to receive a setting of a monitoring target and a setting of a timing at which monitoring target information is to be acquired from an apparatus-side controller that controls plasma processing in a chamber;
a detection unit configured to acquire the monitoring target information transmitted from the monitoring target to the apparatus-side controller at the timing and detects an occurrence of an abnormality in the chamber based on the monitoring target information; and
a controller configured to control a radio frequency power source to stop supplying electric power with respect to the chamber in which the abnormality occurs.

Appendix 16

A plasma processing apparatus for performing a desired processing using plasma in a plasma processing space including:
an apparatus-side controller configured to control the processing performed in the plasma processing space;
a radio frequency power source generation unit configured to supply electric power to the plasma processing space; and
a monitoring unit configured to monitor monitoring target information transmitted from a monitoring target to the apparatus-side controller, detect an occurrence of an abnormality in the plasma processing space based on the monitoring target information, and control the radio frequency power source generation unit to stop supplying electric power from the radio frequency power supply generation unit to the plasma processing space in which the occurrence of the abnormality is detected, the apparatus-side controller setting, for the monitoring unit, the monitoring target monitored by the monitoring unit and the timing of monitoring the monitoring target information.

Appendix 17

The plasma processing apparatus according to the appendix 16,
the apparatus-side controller setting, for the monitoring unit, a threshold for detecting the occurrence of the abnormality in the plasma processing space based on the monitoring target information.

Appendix 18

The plasma processing apparatus according to the appendix 17,
the apparatus-side controller, the monitoring target, and the monitoring unit being connected by a first communication unit for transmitting data by polling,
the apparatus-side controller and the monitoring unit being connected to each other by a second communication unit different from the first communication unit in a communicable manner, and
the apparatus-side controller using the second communication unit, to set, for the monitoring unit, the monitoring target monitored by the monitoring unit, the timing for monitoring the monitoring target information, and the threshold for detecting the occurrence of the abnormality.

Appendix 19

The plasma processing apparatus according to the appendix 18,
the first communication unit performing communication using a master communication unit and the client communication unit of a control network,
the apparatus-side controller including the master communication unit,
each of the monitoring target and the monitoring unit including the client communication unit, and
the monitoring unit acquiring the monitoring target information during a polling period in which the apparatus-side controller acquires the monitoring target information from the monitoring target, and monitoring the monitoring target.

Appendix 20

The plasma processing apparatus according to the appendix 18 or 19,
the monitoring unit using the second communication unit, to provide to the apparatus-side controller the monitoring target information at a timing where the occurrence of the abnormality is detected and the monitoring target information within a desired period before, after, or both the timing, as log information.

Appendix 21

The plasma processing apparatus according to any one of the appendices 16 to 19,
the monitoring unit detecting, as the occurrence of the abnormality in the plasma processing space, an occurrence of an abnormal discharge based on the reflected power information as the monitoring target information, an occurrence of a wafer adsorption abnormality based on the gas back pressure information as the monitoring target information, an occurrence of the wafer adsorption abnormality based on current information of a high voltage power source of an electrostatic chuck as the monitoring target information, or an occurrence of a plasma abnormality based on optical emission spectroscopy information of the plasma as the monitoring target information, or any combination thereof.

Appendix 22

The plasma processing apparatus according to the appendix 21,
the apparatus-side controller setting, for the monitoring unit, a timing for monitoring the reflected power information so as not to perform the monitoring during a period in which an increase in reflected power is predicted by the processing but to perform the monitoring during a period in which an increase in reflected power is not predicted by the processing.

Appendix 23

The plasma processing apparatus according to any one of the appendices 16 to 22 further including:
a flow controller configured to control a flow rate of a gas supplied to the plasma processing space,
the monitoring unit controlling the flow controller to monitor the gas concentration information of the plasma processing space transmitted from the flow controller to the apparatus-side controller, detecting an occurrence of an abnormality of the gas in the plasma processing space based on the gas concentration information, and adjusting the flow rate of the gas supplied to the plasma processing space in which the occurrence of the abnormality of the gas is detected, and
the apparatus-side controller setting, for the monitoring unit, the flow controller of the monitoring target monitored by the monitoring unit, a timing for monitoring the gas concentration information, and a threshold for detecting the occurrence of an abnormality of the gas.

Appendix 24

A monitoring method performed in a plasma processing apparatus that performs a desired processing using plasma in a plasma processing space, the method including:
setting, by an apparatus-side controller that controls the processing performed in the plasma processing space, a monitoring target which supplies electric power to the plasma processing space and a timing for monitoring monitoring target information, for a monitoring unit;
monitoring, by the monitoring unit, the monitoring target information transmitted from the monitoring target to the apparatus-side controller at the timing; and
detecting, by the monitoring unit, an occurrence of an abnormality in the plasma processing space based on the monitoring target information, and controlling a radio frequency power source generation unit to stop supplying electric power from the radio frequency power source generation unit to the plasma processing space in which the occurrence of the abnormality is detected.

Appendix 25

A monitoring device that suppresses an abnormal discharge of a plasma processing apparatus that performs a desired processing using plasma in a plasma processing space, the monitoring device including:
- a setting receiver configured to receive a setting of a monitoring target that supplies electric power to the plasma processing space and a timing for monitoring monitoring target information from an apparatus-side controller that controls the processing performed in the plasma processing space;
- a detection unit configured to monitor the monitoring target information transmitted from the monitoring target to the apparatus-side controller at the timing, and detect an occurrence of an abnormality in the plasma processing space based on the monitoring target information; and
- a controller configured to control a radio frequency power source generation unit to stop supplying electric power from the radio frequency power source generation unit to the plasma processing space, in which the occurrence of the abnormality is detected.

What is claimed is:

1. A plasma processing apparatus comprising:
   a chamber;
   an apparatus-side controller configured to control plasma processing in the chamber; and
   a monitoring unit configured to monitor a monitoring target that is disposed within the chamber, or is connected directly or indirectly to the chamber,
   wherein the apparatus-side controller sets the monitoring target and a timing at which monitoring target information is to be acquired,
   wherein the timing at which the monitoring target information is acquired is a polling period between the monitoring target and the apparatus-side controller during which the monitoring target information is acquired,
   wherein the monitoring unit acquires the monitoring target information transmitted from the monitoring target to the apparatus-side controller, detects an occurrence of an abnormality in the chamber based on the monitoring target information, and controls the monitoring target for the chamber in which the abnormality occurs, and
   wherein, in case of detecting the occurrence of the abnormality in the chamber based on the monitoring target information, the timing at which the monitoring target information is acquired is set to exclude a timing at which the occurrence of the abnormality does not need to be detected, the timing to be excluded being a timing when a value of the monitoring target information increases due to factors other than the occurrence of the abnormality.

2. The plasma processing apparatus according to claim 1,
   wherein the monitoring target is a radio frequency power source that supplies electric power to the chamber, and
   wherein the monitoring unit controls the radio frequency power source to change an electric power supply with respect to the chamber in which the abnormality occurs.

3. The plasma processing apparatus according to claim 2,
   wherein the changing of the electric power supply includes stopping the electric power supply with respect to the chamber in which the abnormality occurs.

4. The plasma processing apparatus according to claim 2,
   wherein the changing of the electric power supply includes synchronizing an electric power supply signal of the radio frequency power source with respect to the chamber in which the abnormality occurs with other information.

5. The plasma processing apparatus according to claim 4 further comprising:
   a flow controller configured to control a flow rate of a gas supplied to the chamber,
   wherein the other information is information on a flow rate of the gas or information on a concentration of the gas.

6. The plasma processing apparatus according to claim 1,
   wherein the monitoring target is the flow controller that controls the flow rate of a gas supplied to the chamber, and
   wherein the monitoring unit controls the flow controller to change the flow rate of a gas with respect to the chamber in which the abnormality occurs.

7. A plasma processing apparatus comprising:
   a chamber;
   an apparatus-side controller configured to control plasma processing in the chamber;
   a radio frequency power source configured to supply electric power to the chamber; and
   a monitoring unit configured to acquire monitoring target information transmitted from a monitoring target to the apparatus-side controller, detect an occurrence of an abnormality in the chamber based on the monitoring target information, and control the radio frequency power source to stop supplying electric power with respect to the chamber in which the abnormality occurs,
   wherein the apparatus-side controller sets, for the monitoring unit, the monitoring target and a timing at which the monitoring target information is to be acquired,
   wherein the timing at which the monitoring target information is acquired is a polling period between the monitoring target and the apparatus-side controller during which the monitoring target information is acquired, and
   wherein, in case of detecting the occurrence of the abnormality in the chamber based on the monitoring target information, the timing at which the monitoring target information is acquired is set to exclude a timing at which the occurrence of the abnormality does not need to be detected, the timing to be excluded being a timing when a value of the monitoring target information increases due to factors other than the occurrence of the abnormality.

8. The plasma processing apparatus according to claim 7,
   wherein the apparatus-side controller sets, for the monitoring unit, a threshold for detecting the occurrence of the abnormality in the chamber based on the monitoring target information.

9. The plasma processing apparatus according to claim 8,
   wherein the apparatus-side controller, the monitoring target, and the monitoring unit are connected by a first communication unit for transmitting data by polling,
   wherein the apparatus-side controller and the monitoring unit are connected to each other by a second communication unit different from the first communication unit in a communicable manner, and
   wherein the apparatus-side controller uses the second communication unit, to set, for the monitoring unit, the monitoring target, the timing at which the monitoring target information is to be acquired, and the threshold.

10. The plasma processing apparatus according to claim 9,
wherein the first communication unit performs communication using a master communication unit and a client communication unit of a control network,
wherein the apparatus-side controller includes the master communication unit, and
wherein each of the monitoring target and the monitoring unit includes the client communication unit.

11. The plasma processing apparatus according to claim 9,
wherein the monitoring unit uses the second communication unit to provide to the apparatus-side controller both the monitoring target information at a timing where the occurrence of the abnormality is detected and the monitoring target information within a desired period before, after, or both the timing, as log information.

12. The plasma processing apparatus according to claim 7,
wherein the monitoring unit detects, as the occurrence of the abnormality in the chamber, an occurrence of abnormal discharge based on reflected power information as the monitoring target information, an occurrence of a wafer adsorption abnormality based on gas back pressure information as the monitoring target information, an occurrence of the wafer adsorption abnormality based on current information of a high voltage power source of an electrostatic chuck as the monitoring target information, or an occurrence of a plasma abnormality based on optical emission spectroscopy information of the plasma as the monitoring target information, or any combination thereof.

13. The plasma processing apparatus according to claim 12,
wherein the apparatus-side controller sets, for the monitoring unit, a timing at which the reflected power information is to be acquired so as not to acquire the monitoring target information during a period in which an increase in reflected power is predicted by the plasma processing but to acquire the monitoring target information during a period in which an increase in reflected power is not predicted by the plasma processing.

14. The plasma processing apparatus according to claim 7 further comprising:
a flow controller configured to control a flow rate of a gas supplied to the chamber,
wherein the monitoring unit controls the flow controller to acquire gas concentration information of the chamber transmitted from the flow controller to the apparatus-side controller, detects an occurrence of an abnormality of the gas in the chamber based on the gas concentration information, and adjusts the flow rate of the gas supplied with respect to the chamber in which the abnormality occurs, and
wherein the apparatus-side controller sets, for the monitoring unit, the flow controller of the monitoring target, a timing at which the gas concentration information is to be acquired, and a threshold for detecting the occurrence of an abnormality in the gas.

15. A monitoring device for suppressing abnormal discharge of a plasma processing apparatus, the monitoring device comprising:
a setting receiver configured to receive a setting of a monitoring target and a setting of a timing at which monitoring target information is to be acquired from an apparatus-side controller that controls plasma processing in a chamber;
a detection unit configured to acquire the monitoring target information transmitted from the monitoring target to the apparatus-side controller at the timing, and detect an occurrence of an abnormality in the chamber based on the monitoring target information; and
a controller configured to control a radio frequency power source to stop supplying electric power with respect to the chamber in which the abnormality occurs,
wherein the timing at which the monitoring target information is acquired is a polling period between the monitoring target and the apparatus-side controller during which the monitoring target information is acquired, and
wherein, in case of detecting the occurrence of the abnormality in the chamber based on the monitoring target information, the timing at which the monitoring target information is acquired is set to exclude a timing at which the occurrence of the abnormality does not need to be detected, the timing to be excluded being a timing when a value of the monitoring target information increases due to factors other than the occurrence of the abnormality.

* * * * *